(12) United States Patent
Li et al.

(10) Patent No.: US 9,484,364 B2
(45) Date of Patent: Nov. 1, 2016

(54) ARRAY SUBSTRATE AND METHOD FOR MANUFACTURING THE SAME, DISPLAY DEVICE

(71) Applicants: BOE TECHNOLOGY GROUP CO., LTD, Beijing (CN); BEIJING BOE OPTOELECTRONICS TECHNOLOGY CO., LTD., Beijing (CN)

(72) Inventors: Jing Li, Beijing (CN); Wenyu Zhang, Beijing (CN); Jiaxiang Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 233 days.

(21) Appl. No.: 14/386,209

(22) PCT Filed: Dec. 3, 2013

(86) PCT No.: PCT/CN2013/088430
§ 371 (c)(1),
(2) Date: Sep. 18, 2014

(87) PCT Pub. No.: WO2015/000257
PCT Pub. Date: Jan. 8, 2015

(65) Prior Publication Data
US 2016/0247840 A1 Aug. 25, 2016

(30) Foreign Application Priority Data
Jul. 5, 2013 (CN) .......................... 2013 1 0282257

(51) Int. Cl.
*H01L 27/12* (2006.01)
*H01L 29/417* (2006.01)
*H01L 23/50* (2006.01)

(52) U.S. Cl.
CPC ............. *H01L 27/124* (2013.01); *H01L 23/50* (2013.01); *H01L 27/1288* (2013.01); *H01L 29/41733* (2013.01); *H01L 29/41741* (2013.01); *H01L 29/41775* (2013.01)

(58) Field of Classification Search
None
See application file for complete search history.

(56) References Cited

U.S. PATENT DOCUMENTS 6,320,221 B1 * 11/2001 Choi ..................... G02F 1/1368
257/329

FOREIGN PATENT DOCUMENTS

| CN | 103018977 A | 4/2013 |
|---|---|---|
| CN | 103309105 A | 9/2013 |

OTHER PUBLICATIONS

Written Opinion of the International Searching Authority dated Apr. 3, 2014; PCT/CN2013/088430.

*Primary Examiner* — Daniel Luke
(74) *Attorney, Agent, or Firm* — Ladas & Parry LLP

(57) ABSTRACT

An array substrate and a display device are presented. The array substrate includes: a base substrate and a plurality of thin film transistor units located on the base substrate, wherein, the thin film transistor unit includes: a first gate electrode located on the base substrate, a gate insulating layer located on the first gate electrode, a drain electrode disposed in the same layer as the first gate electrode, an active layer located on the drain electrode, a source electrode located on the active layer, a first transparent conductive layer is provided between the base substrate and the first gate electrode and the drain electrode that are disposed in the same layer, and the gate insulating layer is also disposed between the first gate electrode plus the first transparent conductive layer beneath it and the drain electrode plus the first transparent conductive layer beneath it.

19 Claims, 3 Drawing Sheets

ARRAY SUBSTRATE AND METHOD FOR MANUFACTURING THE SAME, DISPLAY DEVICE

TECHNICAL FIELD

Embodiments of the present invention relate to an array substrate, a method for manufacturing the same, and a display device.

BACKGROUND

Thin Film Transistor Liquid Crystal Displays (TFT-LCDs) have the merits of small volume, low power consumption, irradiation-free, etc., and play a leading role in the field of flat panel display.

According to difference in the form of electric field, LCDs can be classified into many types, among which, TFT-LCDs of an Advanced super Dimension Switch (briefly called as ADS) mode are widely used as they have the merits of wide viewing angle, high aperture ratio, high transmittance, etc. The ADS mode is a core technology of planar electric field wide viewing angle, and its characteristic descriptions of the core technology are: a multi-dimensional electric field is formed by an electric field produced at edges of slit electrodes within the same plane and an electric field produced between a layer of the slit electrodes and a layer of a plate-like electrode, so as to allow liquid crystal molecules with every alignment within a liquid crystal cell, which are located directly above the electrode and between the slit electrodes, to be rotated, and thereby the work efficiency of liquid crystals is enhanced and the transmissive efficiency is increased. With a switch technology of the ADS mode, the picture quality of a TFT-LCD product can be improved, and it has the merits of high resolution, high transmittance, low power consumption, wide viewing angle, high aperture ratio, low chromatic aberration, push Mura-free, and so on. For different applications, improved technologies of the ADS technology are high transmittance I-ADS technology, high aperture ratio H-ADS, high resolution S-ADS technology, etc.

Owing to the constraint of process factors, a conductive channel of a TFT of an ADS type liquid crystal panel in prior art has a larger channel length, which not only decreases the size of an on-state current, but also restricts increasing of an aperture ratio of pixels indirectly. And, it only can be made by being subjected to a seven-masking process in general, so that difficulty and cost of the manufacture are relatively high, and the yield is low.

SUMMARY

In a first aspect of the invention, there is provided an array substrate, comprising: a base substrate and a plurality of thin film transistor units located on the base substrate, wherein, the thin film transistor unit includes: a first gate electrode located on the base substrate, a gate insulating layer located on the first gate electrode, a drain electrode disposed in the same layer as the first gate electrode, an active layer located on the drain electrode, a source electrode located on the active layer, a first transparent conductive layer is provided between the base substrate and the first gate electrode and the drain electrode that are disposed in the same layer, and the gate insulating layer is further disposed between the first gate electrode plus the first transparent conductive layer beneath it and the drain electrode plus the first transparent conductive layer beneath it.

A passivation layer is disposed on the thin film transistor unit, a second transparent conductive layer is disposed on the passivation layer, the first transparent conductive layer includes a protrusive portion protruding from the underneath of the drain electrode to the outside of the thin film transistor unit, and the protrusive portion at least in part overlaps with the second transparent conductive layer.

The array substrate further includes: a plurality of gate on array units located on the base substrate, wherein, the gate on array unit includes: a third transparent conductive layer located on the base substrate, a second gate electrode located on the third transparent conductive layer, and a metal wire located on the second gate electrode; the first gate electrode and the second gate electrode as well as the drain electrode are disposed in the same layer, the metal wire and the source electrode are disposed in the same layer, and the third transparent conductive layer and the first transparent conductive layer are disposed in the same layer.

An opening hole is provided in a portion of the passivation layer corresponding to the metal wire, and the second transparent conductive layer is connected to the metal wire through the opening hole.

The array substrate further includes a data line and a gate line, the source electrode and the data line are disposed in the same layer, and the first gate electrode and the gate line are disposed in the same layer.

The second transparent conductive layer is slit electrodes.

In a technical solution of the invention, there is provided an array substrate, comprising thin film transistor units. When the first gate electrode of the thin film transistor unit is in operation, channel length of a conductive channel is just thickness of the active layer. The channel length can be decreased as long as thickness of the active layer is reduced, so that on-state current is raised, and meanwhile a high aperture ratio of pixels is guaranteed.

Thus, display effect of the display device is improved.

In a second aspect of the invention, there is provided a display device, comprising the above array substrate.

In a third aspect of the invention, there is provided a manufacturing method of an array substrate, comprising a step of forming a plurality of thin film transistor units:

forming a pattern including a first transparent conductive layer on a base substrate;

forming a pattern including a first gate electrode and a drain electrode on the pattern of the first transparent conductive layer, the first gate electrode and the drain electrode being disposed in the same layer;

forming a pattern including a gate insulating layer on the first gate electrode, forming a pattern including an active layer on the drain electrode;

forming a pattern including a source electrode on the active layer;

forming a pattern including a passivation layer and a pattern including a second transparent conductive layer on the pattern of the source electrode, sequentially.

The method further includes a step of forming a plurality of gate on array units:

forming a third transparent conductive layer on the base substrate to be in the same layer as the first transparent conductive layer;

forming the drain electrode and a second gate electrode in the same layer as the first gate electrode;

forming a metal wire in the same layer as the source electrode.

In a portion of the passivation layer corresponding to the metal wire, there is provided an opening hole, through which, the second transparent conductive layer is connected to the metal wire.

The method further includes: forming a data line in the same layer as the source electrode, and forming a gate line in the same layer as the first gate electrode.

The second transparent conductive layer is slit electrodes.

The array substrate that includes a plurality of thin film transistor units and a plurality of gate on array units is finished by using five patterning processes, and details are:

forming a first transparent conductive thin film, a first metal thin film, a semiconductor thin film on a base substrate in sequence, and etching them through a first masking process to form a second gate electrode and a third transparent conductive layer situated in a gate on array unit region and a first gate electrode and a gate line, a first transparent conductive layer, a drain electrode and an active layer in a thin film transistor unit region;

forming a first insulating thin film, and etching it through a second masking process to form a pattern including a gate insulating layer;

forming a second metal thin film, and etching it through a third masking process to form a data line, a source electrode, and a metal wire of the gate on array units;

forming a second insulating thin film, and etching it through a fourth masking process to form a pattern including a passivation layer, which has an opening hole provided in a portion of it corresponding to the metal wire;

forming a second transparent conductive thin film, and etching it through a fifth masking process to form a pattern including a second transparent conductive layer, a portion of which situated in the gate on array unit region is connected to the metal wire through the opening hole.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Embodiment 1

Figure 1:
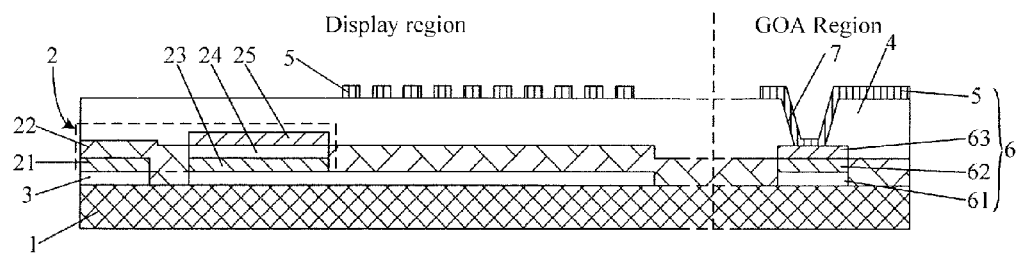
FIG. 1 is a first structurally schematic view illustrating an array substrate in an embodiment of the invention.

According to an embodiment of the invention, there is provided an array substrate. As illustrated in FIG. 1, it includes: a base substrate 1 and a plurality of thin film transistor units 2 located on the base substrate 1, which are situated in a display region of the array substrate.

The thin film transistor unit 2 includes: a first gate electrode 21 located on the base substrate 1, a gate insulating layer 22 located on the first gate electrode 21, a drain electrode 23 disposed in the same layer as the first gate electrode 21, an active layer 24 located on the drain electrode 23, a source electrode 25 located on the active layer 24, a first transparent conductive layer 3 is provided between the base substrate 1 and the first gate electrode 21 and the drain electrode 23 that are disposed in the same layer, and the gate insulating layer 22 is disposed between the first gate electrode 21 plus the first transparent conductive layer 3 beneath it and the drain electrode 23 plus the first transparent conductive layer 3 beneath it.

In order to ensure that an image signal can be written onto a liquid crystal pixel timely and accurately within a row cycle, the on-state current $I_{on}$ of a thin film transistor unit 2 of a pixel must be large enough. Generally, it is greater than $10^{-6}$ Å. The on-state current $I_{on} \alpha (W/L)$, wherein, W is the channel width of a conductive channel of a TFT, and L is the channel length of the conductive channel of the TFT. If the channel length L remains unchanged, then as the channel width W increases, the on-state current $I_{on}$ is increased and the aperture ratio of a pixel is decreased. So, in actual applications, on the premise that lithography precision and yield are guaranteed, the shorter the channel length L of a TFT is, the better the effect is. Yet, under the restraint of masking process, the channel length L cannot be made to be small enough sometimes, and this restricts the raise of the aperture ratio of a pixel indirectly.

While in an embodiment of the invention, as illustrated in FIG. 1, when the first gate electrode 21 is in operation, the channel length L is just the thickness of the active layer 24. The channel length L can be decreased as long as thickness of the active layer 24 is reduced, so that on-state current $I_{on}$ is raised, and meanwhile a high aperture ratio of pixels is guaranteed. Thus, display effect of the display device is improved.

In a technical solution of the invention, there is provided an array substrate, comprising thin film transistor units. When the first gate electrode of the thin film transistor unit is in operation, channel length of a conductive channel is just thickness of the active layer. The channel length can be decreased as long as thickness of the active layer is reduced, so that on-state current is raised, and meanwhile a high aperture ratio of pixels is guaranteed. Thus, display effect of the display device is improved.

For example, the first transparent conductive layer 3 is further included between the first gate electrode 21 and the base substrate 1, and the first gate electrode 21 and the first transparent conductive layer 3 are combined together to form a gate electrode of the thin film transistor unit 2. As compared to the case where a gate electrode only includes a first gate electrode 21, the gate electrode with a structure of two layers has a stronger ability of conductivity, and has a lower resistance value.

The base substrate 1 may be made of glass, quartz or other common transparent substance. The first gate electrode 21 or the drain electrode 23 has a thickness in the range of 100 nm to 500 nm, and it may be made of one selected from the group consisting of molybdenum, aluminum, tungsten, titanium, copper or other metal or their alloy in monolayer, and may also be made by a multilayered combination of the above-mentioned metals. Besides, the first gate electrode 21 and the drain electrode 23 may be made with the same material. Similarly, thickness of the source electrode 25 may also be in the range of 100 nm to 500 nm, and it may be made of one selected from the group consisting of molybdenum, aluminum, tungsten, titanium, copper or other metal or their alloy in monolayer, and may also be made by a multilayered combination of the above-mentioned metals.

For example, the active layer 4 may be formed with amorphous silicon, polysilicon silicon, indium gallium zinc oxide or other common semiconductor material, and its thickness is in the range of 100 nm to 300 nm. The first transparent conductive layer 3 may be of indium tin oxide, indium zinc oxide or other common transparent conductive material, and its thickness is in the range of 50 nm to 500 nm.

For example, a passivation layer 4 is disposed on the thin film transistor unit 2, a second transparent conductive layer 5 is disposed on the passivation layer 4, and the first transparent conductive layer 3 overlaps the second transparent electrode 5 at least in part. As can be seen from FIG. 1, the first transparent conductive layer 3 includes a protrusive portion protruding from the underneath of the drain electrode 23 to the outside of the thin film transistor unit 2. For example, the protrusive portion overlaps the second transparent conductive layer at least in part. Thereby, the protrusive portion and the second transparent electrode 5 constitute a display electrode. For example, within a display region, one of the first transparent conductive layer 3 and the second transparent conductive layer functions as a pixel electrode, and the other one functions as a common electrode.

The first transparent conductive layer 3 is disposed between the base substrate 1 and the drain electrode 23, which means that the first transparent conductive layer 3 is connected to the drain electrode 23. In this case, the first transparent conductive layer 3 may be referred to as a pixel electrode, and relatively speaking, the second transparent conductive layer 5 may be referred to as a common electrode. Therefore, the first transparent conductive layer 3 and the second transparent conductive layer 5 cooperate with each other to produce an electric field in parallel to the base substrate 1, and serve to jointly drive liquid crystals of an ADS type liquid crystal panel to be deflected.

In an embodiment of the invention, the first transparent conductive layer 3 may be a plate-like electrode or slit electrodes, and the second transparent conductive layer 5 is slit electrodes.

The second transparent conductive layer 5 may be indium tin oxide, indium zinc oxide or other common transparent conductive material, and its thickness is in the range of 50 nm to 500 nm.

In addition, for the sake of improving the display effect of display devices further, more and more people began to pay attention to a narrow frame design for display devices. In prior art, a narrow-frame display is usually manufactured by such a way that the process margin is compressed to the limit, and one of very important technologies in it is implementation of a Gate On Array (briefly called as GOA) technology for batch production. With the GOA technology, a gate switch circuit is integrated on an array substrate of a display panel of a display device, so as to achieve scan driving of the display panel. Thus, an integrated circuit portion for gate driving can be omitted. Therefore, not only the product cost can be reduced from two aspects of material cost and manufacturing process, but also beautiful designs of bilateral symmetrization and narrow frame can be achieved by the display device.

Therefore, in an embodiment of the invention, the array substrate may further include: a plurality of GOA units 6 located on the base substrate 1, which are situated in a GOA region in the array substrate, wherein, the GOA unit 6 includes: a third transparent conductive layer 61 located on the base substrate 1, a second gate electrode 62 located on the third transparent conductive layer 61, and a metal wire 63 located on the second gate electrode 62.

For example, in an embodiment of the invention, the first gate electrode 21 and the drain electrode 23 of a thin film transistor unit 2 are disposed in the same layer as the second gate electrode 62 of a GOA unit, the metal wire 63 is disposed in the same level as the source electrode 25, and the third transparent conductive layer 61 is disposed in the same layer as the first transparent conductive layer 3.

It is to be noted that, the second transparent conductive layer 5 in the GOA region is used for connection to a gate drive circuit, so as to receive an electric signal from the gate drive circuit. The electric signal is transferred to a thin film transistor unit 2 of the array substrate via the metal wire 63, so as to drive the thin film transistor unit 2 to work. In order to ensure that connection between the second transparent conductive layer 5 in the GOA region and the gate drive circuit is reliable, for example, an opening hole 7 is provided in a portion of the passivation layer 4 corresponding to the metal wire 63, and the second transparent conductive layer 5 can be connected to the metal wire 63 through the opening hole 7. For such a connecting scheme, the manufacturing process is simple, and the connecting effect is stable.

For example, for the ease of connection between the source electrode and the data line, the source electrode and the data line are disposed in the same layer, and the source electrode may be integrally formed with the data line, namely, it is equivalent to a part of the data line. Similarly, the first gate electrode is disposed in the same layer as a gate line, and the first gate electrode may be integrally formed with the gate line, namely, it is equivalent to a part of the gate line.

According to the embodiment of the invention, there is further provided a display device, comprising any of the above-mentioned array substrate. The display device may be a liquid crystal panel, an electronic paper, an OLED panel, a cell phone, a tablet computer, a television, a display, a notebook computer, a digital photo frame, a navigator, or any other product or component having a display function.

Embodiment 2

According to an embodiment of the invention, there is provided a manufacturing method for manufacturing the array substrate illustrated in FIG. 1, comprising the following step of forming a plurality of thin film transistor units:

Step S11, a pattern including a first transparent conductive layer is formed on a base substrate.

Step S12, a pattern including a first gate electrode and a drain electrode is formed on the pattern of the step S11, the first gate electrode and the drain electrode being disposed in the same layer.

Step S13, a pattern including a gate insulating layer is formed on the first gate electrode formed by the step S12, a pattern including an active layer is formed on the drain electrode.

Step S14, a pattern including a source electrode is formed on the active layer formed by the step S13.

Figure 2:
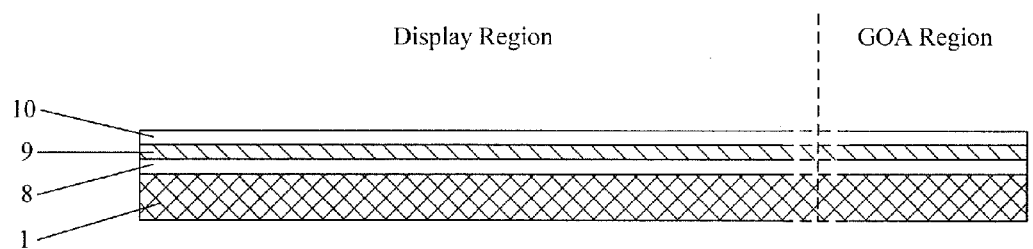
FIG. 2 is a second structurally schematic view illustrating an array substrate in an embodiment of the invention.

For example, the manufacturing method of the array substrate illustrated in FIG. 2 may further include:

Step S15, a pattern including a passivation layer and a pattern including a second transparent conductive layer are formed on the pattern of S14, sequentially.

Furthermore, while the thin film transistor units are formed, the manufacturing method of the array substrate provided by the embodiment of the invention may further include a step of forming a plurality of gate on array units:

the first transparent conductive layer and a third transparent conductive layer are formed on the base substrate to be in the same layer in the step S11.

The first gate electrode, the drain electrode and a second gate electrode are formed in the same layer in the step S12.

The source electrode and a metal wire are formed in the same layer in the step S14.

Different structures disposed in the same layer may be formed in the same patterning process, and may also be formed in a plurality of patterning processes, respectively. Embodiments of the invention do not set a limit to this.

In an embodiment of the invention, the source electrode and the data line for the array substrate made by the manufacturing method of the array substrate are formed in the same layer, and may be integrally formed in the same patterning process. Similarly, the first gate electrode and the gate line are formed in the same layer.

In an embodiment of the invention, the first transparent conductive layer 3 may be a plate-like electrode or slit electrodes, and the second transparent conductive layer 5 is slit electrodes.

The following is a concrete embodiment of the manufacturing method of the array substrate provided by embodiments of the invention. Obviously, it is merely a specific manufacturing method of the array substrate corresponding to FIG. 1, and in addition to this, other method may also be used for manufacture of the array substrate illustrated in FIG. 1.

Upon manufacture of the plurality of thin film transistor units 2 and a plurality of gate on array units 6 of the array substrate, only by using a five-patterning process, this manufacturing method can be finished. It includes:

Step S101, a first transparent conductive thin film, a first metal thin film, and a semiconductor thin film are formed on a base substrate in sequence, and they are etched through a first masking process to form a second gate electrode and a third transparent conductive layer situated in a gate on array unit region and a first gate electrode and a gate line, a first transparent conductive layer, a drain electrode and an active layer in a thin film transistor unit region.

As illustrated in FIG. 2, by means of magnetron sputtering, thermal evaporation or the like, a first transparent conductive thin film 8 and a first metal thin film 9 are sequentially formed on a base substrate 1, and after that, a semiconductor thin film 10 is deposited by way of Plasma Enhanced Chemical Vapor Deposition (briefly called as PECVD) method.

Figure 3A:
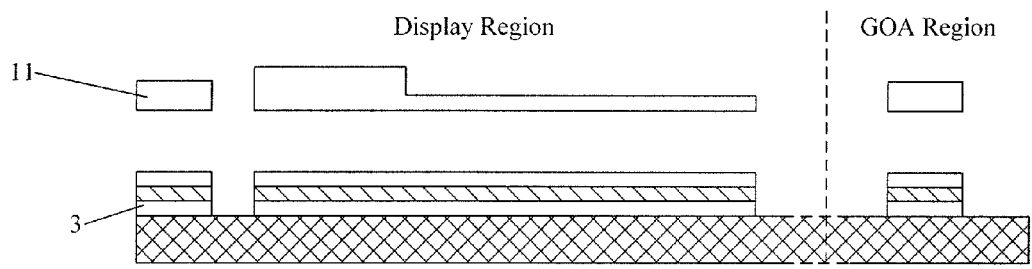
FIGS. 3a to 3c are structurally schematic views illustrating a manufacturing process of an array substrate in an embodiment of the invention.
Figure 3B:
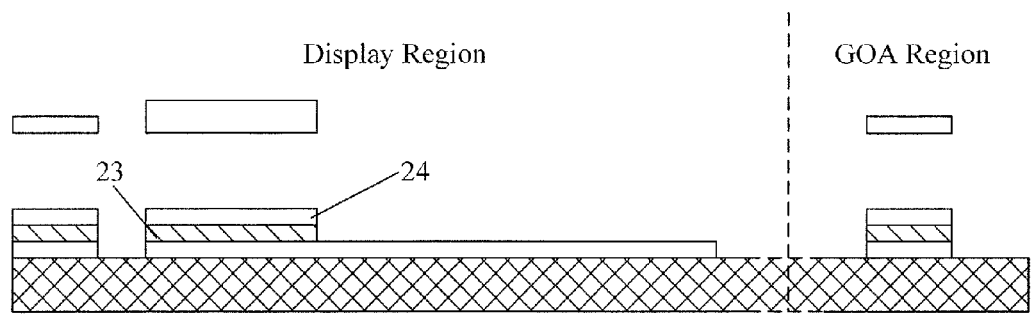
Figure 3C:
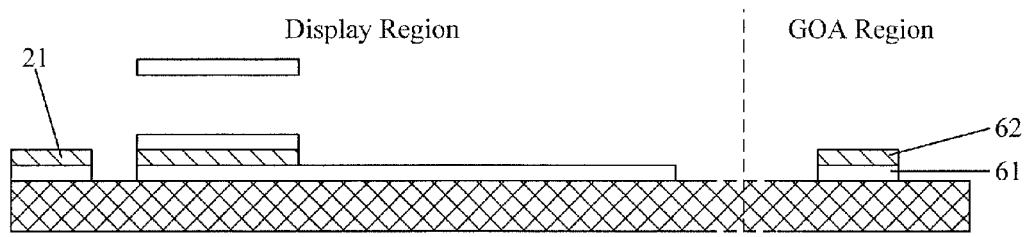
Figure 4:
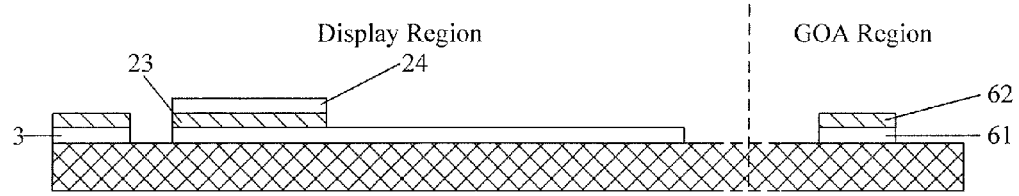
FIG. 4 is a third structurally schematic view illustrating an array substrate in an embodiment of the invention.

Upon a first masking process, a layer of photoresist 11 is coated on the semiconductor thin film, and is exposed with a half-tone or gray-tone mask, so that a fully-exposed region, a non-exposed region, a small-partially exposed region and a large-partially exposed region are formed in the photoresist. By an etch process, the semiconductor thin film 10, the first metal thin film 9 and the first transparent conductive thin film 8 that correspond to the fully-exposed region are etched away, as illustrated in FIG. 3a. After etching of the first transparent conductive thin film 8 is finished, a pattern including a first transparent conductive layer 3 is formed. The photoresist 11 in the large-partially exposed region is removed by an ashing process, so as to expose the semiconductor thin film 10 corresponding to that portion of the exposed region; and the exposed semiconductor thin film 10 and first metal thin film 9 are etched away fully by an etch process, so as to form a pattern including an active layer 24 and a drain electrode 23 of a thin film transistor unit 2, as illustrated in FIG. 3b. The photoresist 11 in the small-partially exposed region is removed by once more performing an ashing process, so as to expose the semiconductor thin film 10 in that region; and the exposed semiconductor thin film 10 is etched away fully by once more performing an etch process, so as to form pattern of the first gate electrode 21 of the thin film transistor unit 2 and pattern of the second gate electrode 62 and the third transparent conductive layer 61 in a GOA region, as illustrated in FIG. 3c. Finally, the remaining photoresist is removed by an ashing process, as illustrated in FIG. 4.

In an embodiment of the invention, a gate line of the array substrate is also formed when pattern of the first gate electrode 21 is formed. Furthermore, the gate line may be integrally formed with the first gate electrode 21, so that the process flow is saved, and moreover, the hierarchical structure of the array substrate is simplified.

Substance for the base substrate 1 is usually glass or quartz. The first transparent conductive thin film 8 may be indium tin oxide, indium zinc oxide or the like, and its thickness is in the range of 50 nm to 500 nm. The semiconductor thin film 10 may be formed with amorphous silicon, polycrystalline silicon, indium gallium zinc oxide or other semiconductor material, and its thickness is in the range of 100 nm to 300 nm.

Step S102, a first insulating thin film is formed, and is etched by a second masking process to form a pattern including a gate insulating layer.

Figure 5:
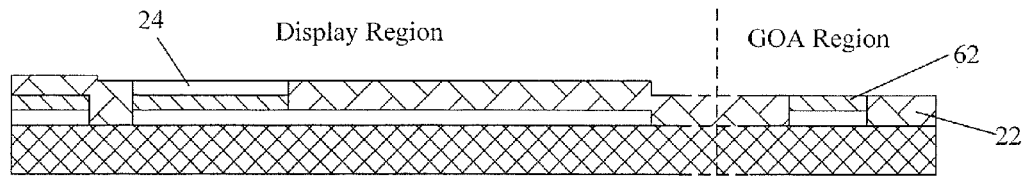
FIG. 5 is a fourth structurally schematic view illustrating an array substrate in an embodiment of the invention.

On the basis of structure of the array substrate illustrated in FIG. 4, a layer of first insulating thin film is formed by depositing it with a PECVD method, and in a second masking process, pattern of a gate insulating layer 22 is formed by a patterning process with a common mask to expose the active layer 24 and the second gate electrode 62 in the GOA region, as illustrated in FIG. 5. On the first gate electrode 21 lies the gate insulating layer 22, on the first transparent conductive layer 3 lies the gate insulating layer 22, between the first gate electrode 21 plus the first transparent conductive layer 3 underneath it and the drain electrode 23 plus the first transparent conductive layer 3 underneath it lies the gate insulating layer 22 (this portion of the gate insulating layer 22 is situated on the base substrate 1), and between the first transparent conductive layer 3 and the third transparent conductive layer 7 lies the gate insulating layer 22 (this portion of the gate insulating layer 22 is situated on the base substrate 1).

The gate insulating layer 22 is, such as the insulating material of silicon oxide, and besides, silicon nitride, hafnium oxide or other insulating material may also be used for it. A multilayered combination of multiple insulating materials as stated above may also be possible, and the thickness is in the range of 100 nm to 300 nm.

Step S103, a second metal thin film is formed, and is etched by a third masking process to form a data line, a source electrode, and a metal wire of the gate on array units.

On the basis of structure of the array substrate illustrated in FIG. 5, a layer of second metal thin film is formed by depositing it with a magnetron sputtering or thermal evaporation method. The second metal thin film may be made of one selected from the group consisting of molybdenum, aluminum, tungsten, titanium, copper or other metal or their alloy in monolayer, and may also be made by a multilayered combination of the above-mentioned metals, and its thickness is in the range of 100 nm to 500 nm. In a third masking process, a pattern including a source electrode 25 of the thin film transistor unit 2 illustrated in FIG. 6 is formed by a patterning process with a common mask.

Figure 6:
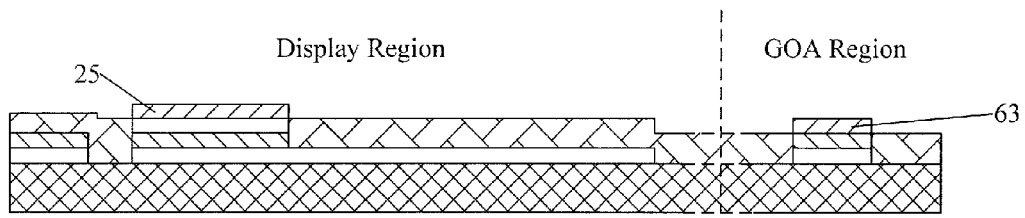
FIG. 6 is a fifth structurally schematic view illustrating an array substrate in an embodiment of the invention.

In the step S103, when pattern of the source electrode 25 is formed, pattern of a metal wire 63 in the GOA region is also formed by using the second metal thin film, so as to form the structure of the array substrate illustrated in FIG. 6.

Step S104, a second insulating thin film is formed, and is etched by a fourth masking process to form a pattern including a passivation layer, which has an opening hole provided in a portion of it corresponding to the metal wire.

On the basis of structure of the array substrate illustrated in FIG. 6, a layer of second insulating thin film is formed by depositing it with a PECVD method. Similarly, the second insulating thin film may adopt the same material used for the gate insulating layer 22, and its thickness is in the range of 100 nm to 300 nm. In a fourth masking process, the second insulating thin film is etched by a patterning process with a common mask, so as to form a pattern including a passivation layer 4, wherein, an opening hole 7 is provided in a portion of the passivation layer 4 corresponding to the metal wire 63, as illustrated in FIG. 7.

Step S105, a second transparent conductive thin film is formed, and is etched by a fifth masking process to form a pattern including a second transparent conductive layer, which is connected to the metal wire through the opening hole.

Figure 7:
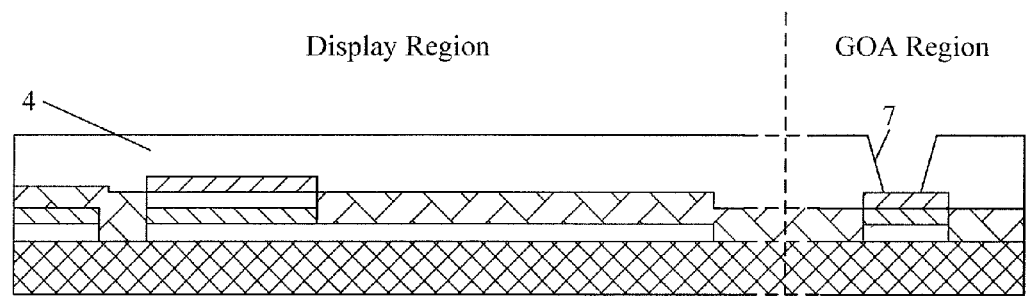
FIG. 7 is a sixth structurally schematic view illustrating an array substrate in an embodiment of the invention.

On the basis of structure of the array substrate illustrated in FIG. 7, a layer of second transparent conductive thin film is formed by using a magnetron sputtering or thermal evaporation method. The second transparent conductive thin film may adopt indium tin oxide, indium zinc oxide or other substance, and its thickness is in the range of 50 nm to 500 nm. With a common mask, a pattern including a second transparent conductive layer 5 is formed by a patterning process, and connection to the metal wire 63 is achieved for the second transparent conductive layer 5 through the opening hole. Thus, the array substrate illustrated in FIG. 1 can be made.

In an embodiment of the invention, the second transparent conductive layer 5 is such as slit electrodes.

It is to be noted that, the second transparent conductive layer 5 in the GOA region is used for connection to a gate drive circuit, so as to receive an electric signal from the gate drive circuit. The electric signal is transferred to a thin film transistor unit 2 of the array substrate via the metal wire 63, so as to drive the thin film transistor unit 2 to work. For example, the second transparent conductive layer 5 in the GOA region and the second transparent conductive layer 5 in the display region are separated from each other.

In summary, manufacture of the array substrate can be achieved only by using a five-masking process, and as compared to prior art, two masking processes are decreased, the manufacturing difficulty and manufacturing cost are reduced, and the yield of the manufactured array substrate is enhanced.

In the field of display technology, the patterning process may only include a photolithography process, or include a photolithography process and an etch step. Besides, it may also include printing, inkjet or other process for forming a predetermined pattern. The photolithography process refers to such a process that includes film formation, exposure, development and other process procedure, in which a pattern is formed by utilizing a photoresist, a mask, an exposing machine and so on. A corresponding patterning process can be chosen in accordance with the structure to be formed in the invention. The five-masking process mentioned in the invention refers to the case where five masks are used, and a photolithography process and an etch step, or other process may also be employed in it. Here, the term 'masking process' is used merely for the purpose of making a comparison with an existing seven-masking process, and it does not represent that the process step of the invention only includes such a process of employing a mask, and every other process procedure can be chosen arbitrarily.

Although an array substrate of an ADS type liquid crystal panel has been described above as an example, embodiments of the invention are not limited to the array substrate of the ADS type liquid crystal panel. Rather, such an array substrate without common electrode provided thereon may also be possible. Or, structures according to the invention may also be applied to array substrates of organic light emitting display panels.

Descriptions made above are merely exemplary embodiments of the invention, but are not used to limit the protection scope of the invention. The protection scope of the invention is determined by attached claims.

The invention claimed is:

1. An array substrate, comprising: a base substrate and a plurality of thin film transistor units located on the base substrate, wherein,
the thin film transistor unit includes: a first gate electrode located on the base substrate, a gate insulating layer located on the first gate electrode, a drain electrode disposed in the same layer as the first gate electrode, an active layer located on the drain electrode, a source electrode located on the active layer, a first transparent conductive layer is provided between the base substrate and the first gate electrode and the drain electrode that are disposed in the same layer, and the gate insulating layer is further disposed between the first gate electrode plus the first transparent conductive layer beneath it and the drain electrode plus the first transparent conductive layer beneath it.

2. The array substrate claimed as claim 1, wherein, a passivation layer is disposed on the thin film transistor unit, a second transparent conductive layer is disposed on the passivation layer, the first transparent conductive layer includes a protrusive portion protruding from the underneath of the drain electrode to the outside of the thin film transistor unit, and the protrusive portion at least in part overlaps with the second transparent conductive layer.

3. The array substrate claimed as claim 1, further comprising, a plurality of gate on array units located on the base substrate, wherein, the gate on array unit includes: a third transparent conductive layer located on the base substrate, a second gate electrode located on the third transparent conductive layer, and a metal wire located on the second gate electrode; the first gate electrode and the second gate electrode as well as the drain electrode are disposed in the same layer, the metal wire and the source electrode are disposed in the same layer, and the third transparent conductive layer and the first transparent conductive layer are disposed in the same layer.

4. The array substrate claimed as claim 3, wherein, an opening hole is provided in a portion of the passivation layer corresponding to the metal wire, and the second transparent conductive layer is connected to the metal wire through the opening hole.

5. The array substrate claimed as claim 1, further comprising a data line and a gate line, wherein, the source electrode and the data line are disposed in the same layer, and the first gate electrode and the gate line are disposed in the same layer.

6. The array substrate claimed as claim 2, wherein, the second transparent conductive layer is slit electrodes.

7. A display device, comprising the array substrate claimed as claim 1.

8. A manufacturing method of an array substrate, comprising a step of forming a plurality of thin film transistor units:
forming a pattern including a first transparent conductive layer on a base substrate;
forming a pattern including a first gate electrode and a drain electrode on the pattern of the first transparent conductive layer, the first gate electrode and the drain electrode being disposed in the same layer;
forming a pattern including a gate insulating layer on the first gate electrode, and forming a pattern including an active layer on the drain electrode;
forming a pattern including a source electrode on the active layer.

9. The manufacturing method claimed as claim 8, further comprising:
forming a pattern including a passivation layer and a pattern including a second transparent conductive layer on the pattern of the source electrode, sequentially.

10. The manufacturing method claimed as claim 9, further comprising a step of forming a plurality of gate on array units:
forming a third transparent conductive layer on the base substrate to be in the same layer as the first transparent conductive layer;
forming the drain electrode and a second gate electrode in the same layer as the first gate electrode;
forming a metal wire in the same layer as the source electrode.

11. The manufacturing method claimed as claim 10, wherein, in a portion of the passivation layer corresponding to the metal wire, there is provided an opening hole, through which, the second transparent conductive layer is connected to the metal wire.

12. The manufacturing method claimed as claim 8, further comprising: forming a data line in the same layer as the source electrode, and forming a gate line in the same layer as the first gate electrode.

13. The manufacturing method claimed as claim 11, further comprising: forming a data line in the same layer as the source electrode, and forming a gate line in the same layer as the first gate electrode.

14. The manufacturing method claimed as claim 9, wherein, the second transparent conductive layer is slit electrodes.

15. The manufacturing method claimed as claim 13, wherein, the array substrate that includes a plurality of thin film transistor units and a plurality of gate on array units is finished by using a five-patterning process, comprising:
forming a first transparent conductive thin film, a first metal thin film, a semiconductor thin film on a base substrate in sequence, and etching them through a first masking process to form a second gate electrode and a third transparent conductive layer situated in a gate on array unit region and a first gate electrode and a gate line, a first transparent conductive layer, a drain electrode and an active layer in a thin film transistor unit region;
forming a first insulating thin film, and etching it through a second masking process to form a pattern including a gate insulating layer;
forming a second metal thin film, and etching it through a third masking process to form a data line, a source electrode, and a metal wire of the gate on array units;
forming a second insulating thin film, and etching it through a fourth masking process to form a pattern including a passivation layer, which has an opening hole provided in a portion of it corresponding to the metal wire;
forming a second transparent conductive thin film, and etching it through a fifth masking process to form a pattern including a second transparent conductive layer, a portion of which situated in the gate on array unit region is connected to the metal wire through the opening hole.

16. The array substrate claimed as claim 2, further comprising, a plurality of gate on array units located on the base substrate, wherein, the gate on array unit includes: a third transparent conductive layer located on the base substrate, a second gate electrode located on the third transparent conductive layer, and a metal wire located on the second gate electrode; the first gate electrode and the second gate electrode as well as the drain electrode are disposed in the same layer, the metal wire and the source electrode are disposed in the same layer, and the third transparent conductive layer and the first transparent conductive layer are disposed in the same layer.

17. The array substrate claimed as claim 2, further comprising a data line and a gate line, wherein, the source electrode and the data line are disposed in the same layer, and the first gate electrode and the gate line are disposed in the same layer.

18. The array substrate claimed as claim 3, further comprising a data line and a gate line, wherein, the source electrode and the data line are disposed in the same layer, and the first gate electrode and the gate line are disposed in the same layer.

19. The array substrate claimed as claim 4, further comprising a data line and a gate line, wherein, the source electrode and the data line are disposed in the same layer, and the first gate electrode and the gate line are disposed in the same layer.

* * * * *